US011609870B2

(12) United States Patent
Ware et al.

(10) Patent No.: US 11,609,870 B2
(45) Date of Patent: Mar. 21, 2023

(54) OFF-MODULE DATA BUFFER

(71) Applicant: Rambus Inc., San Jose, CA (US)

(72) Inventors: Frederick A. Ware, Los Altos Hills, CA (US); Christopher Haywood, Cary, NC (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 17/296,532

(22) PCT Filed: Nov. 21, 2019

(86) PCT No.: PCT/US2019/062568
§ 371 (c)(1),
(2) Date: May 24, 2021

(87) PCT Pub. No.: WO2020/117481
PCT Pub. Date: Jun. 11, 2020

(65) Prior Publication Data
US 2021/0397570 A1    Dec. 23, 2021

Related U.S. Application Data

(60) Provisional application No. 62/774,950, filed on Dec. 4, 2018.

(51) Int. Cl.
*G06F 13/16* (2006.01)
*G06F 13/40* (2006.01)
(Continued)

(52) U.S. Cl.
CPC ...... *G06F 13/1689* (2013.01); *G06F 13/4068* (2013.01)

(58) Field of Classification Search
CPC ............. G06F 13/1689; G06F 13/4068; G11C 7/1084; G11C 5/04; G11C 7/1054; G11C 11/4093; G11C 11/4096
(Continued)

(56) References Cited

U.S. PATENT DOCUMENTS 5,414,816 A * 5/1995 Oyadomari ............. G06F 13/36
710/60
5,982,772 A * 11/1999 Oskouy ............... H04Q 11/0478
370/473
(Continued)

FOREIGN PATENT DOCUMENTS

WO    WO-2016-089563 A1    6/2016
WO    WO-2017-023508 A1    2/2017
WO    WO-2017023508 A1 *  2/2017 ......... G06F 13/1678

OTHER PUBLICATIONS

Notification of Transmittal of the International Search Report and the Written Opinion of the International Searching Authority, or the Declaration dated Mar. 19, 2020 re: In'tl Appln. No. PCT/US2019/062568. 17 Pages.

*Primary Examiner* — Idriss N Alrobaye
*Assistant Examiner* — Henry W Yu
(74) *Attorney, Agent, or Firm* — Charles Shemwell

(57) ABSTRACT

In a modular memory system, a memory control component, first and second memory sockets and data buffer components are all mounted to the printed circuit board. The first and second memory sockets have electrical contacts to electrically engage counterpart electrical contacts of memory modules to be inserted therein, and each of the data buffer components includes a primary data interface electrically coupled to the memory control component, and first and second secondary data interfaces electrically coupled to subsets of the electrical contacts within the first and second memory sockets, respectively.

20 Claims, 8 Drawing Sheets

(51) Int. Cl.
  *G11C 7/10* (2006.01)
  *G11C 5/04* (2006.01)
  *G11C 11/4093* (2006.01)
  *G11C 11/4096* (2006.01)

(58) Field of Classification Search
  USPC .............. 710/14, 29, 33, 36, 38, 51, 62, 107
  See application file for complete search history.

(56) References Cited

U.S. PATENT DOCUMENTS

| | | | |
|---|---|---|---|
| 6,643,752 B1 | 11/2003 | Donnelly et al. | |
| 6,675,272 B2 | 1/2004 | Ware et al. | |
| 6,708,248 B1 | 3/2004 | Garrett, Jr. et al. | |
| 6,920,540 B2 | 7/2005 | Hampel et al. | |
| 7,307,863 B2 | 12/2007 | Yen et al. | |
| 7,565,461 B2 * | 7/2009 | Huppenthal | G06F 13/385 |
| | | | 710/22 |
| 7,664,166 B2 | 2/2010 | Palmer et al. | |
| 7,793,043 B2 | 9/2010 | Blakely et al. | |
| 8,108,607 B2 | 1/2012 | Shaeffer et al. | |
| 8,275,936 B1 | 9/2012 | Haywood et al. | |
| 8,378,481 B2 | 2/2013 | Lambrecht | |
| 8,898,368 B2 | 11/2014 | Haywood et al. | |
| 9,196,314 B2 | 11/2015 | Cai | |
| 9,268,719 B2 | 2/2016 | Shaeffer | |
| 9,323,458 B2 | 4/2016 | Haywood | |
| 9,569,393 B2 | 2/2017 | Zheng et al. | |
| 10,169,257 B2 | 1/2019 | Woo et al. | |
| 10,169,258 B2 | 1/2019 | Yeung et al. | |
| 2002/0064072 A1 * | 5/2002 | Ooishi | G11C 7/1072 |
| | | | 365/189.05 |
| 2006/0140287 A1 * | 6/2006 | Alon | H04L 5/1423 |
| | | | 375/260 |
| 2016/0070496 A1 * | 3/2016 | Cohen | G06F 12/0246 |
| | | | 711/103 |
| 2016/0314822 A1 | 10/2016 | Yeung et al. | |
| 2017/0133083 A1 | 5/2017 | Li et al. | |
| 2017/0344275 A1 | 11/2017 | Ware et al. | |

* cited by examiner

FIG. 1  Load-Reduced Memory System with Off-Module Data Buffers

FIG. 2 *Off-Module Data Buffer (OMDB) Read-Timing Examples*

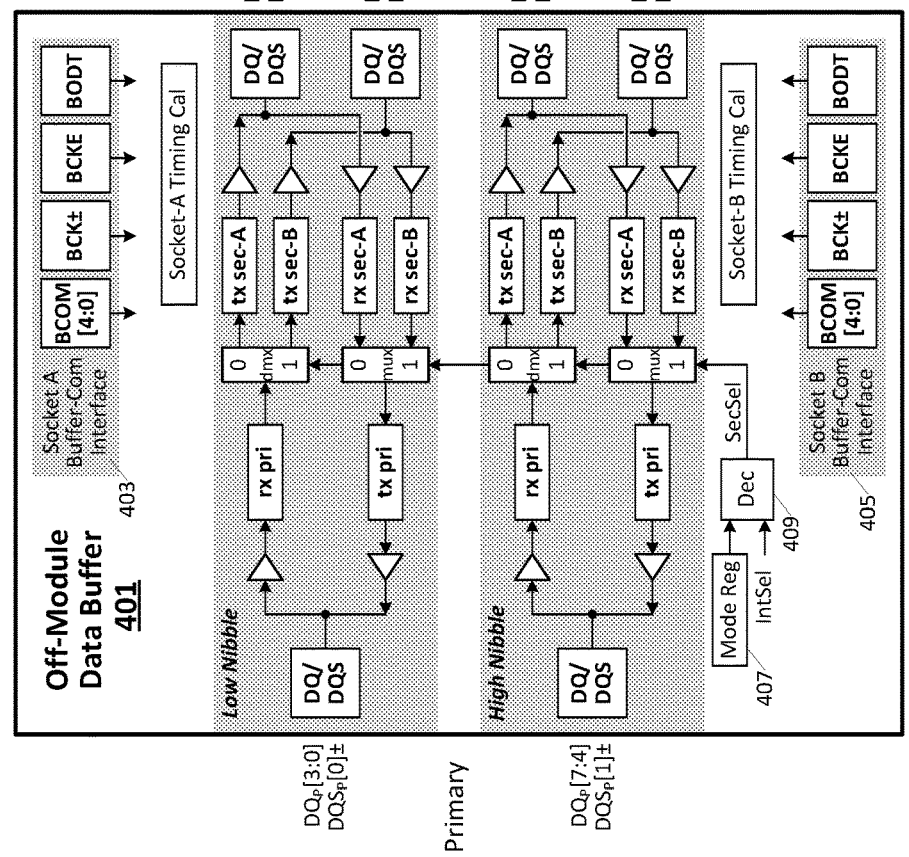

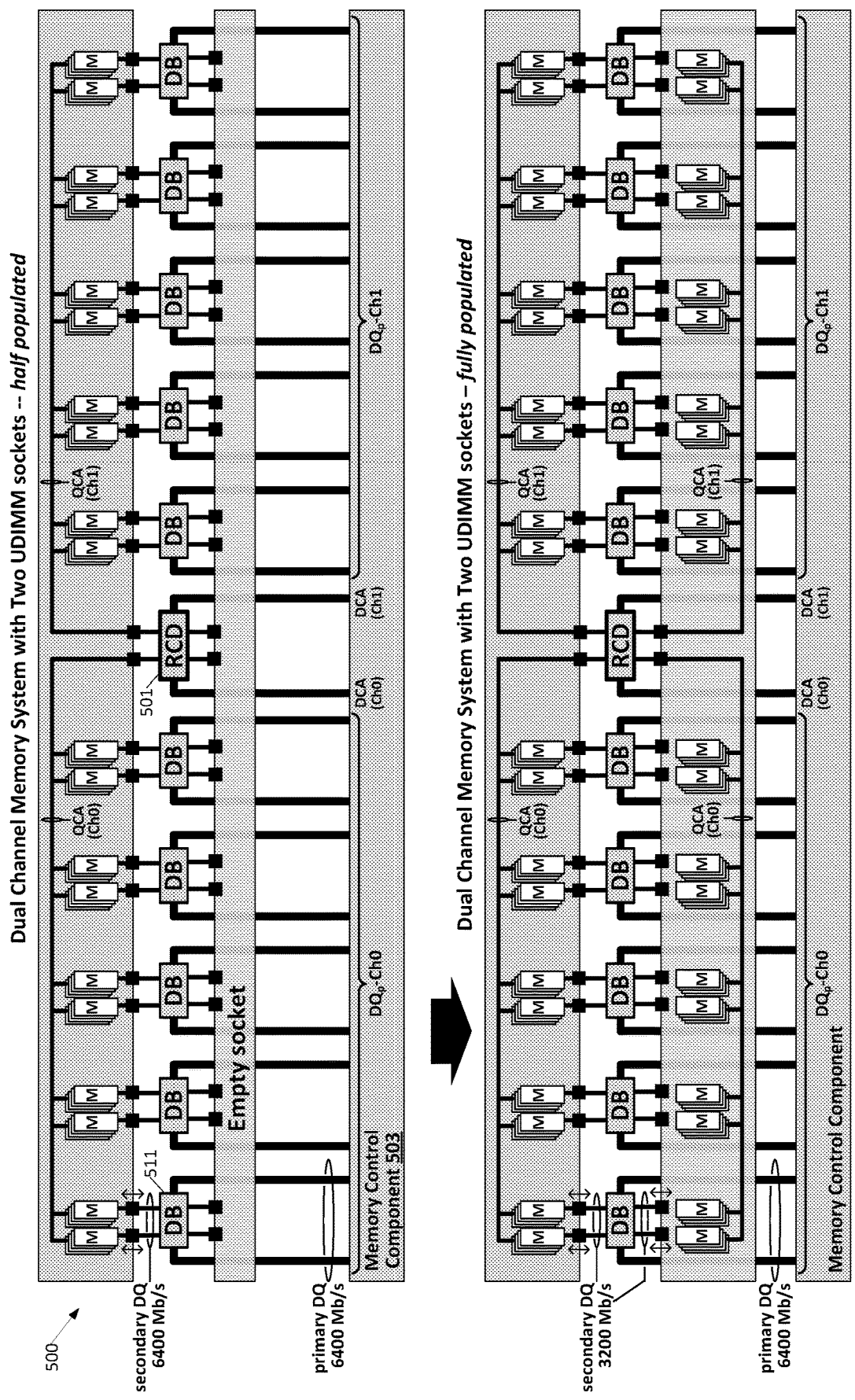
FIG. 8  Load-Reduced Memory System with Off-Module Data Buffers and Off-Module RCD Partition each 6-bus OMDB into two 3-bus OMDBs, each to convey a respective nibble to/from respective memory modules Partition each 6-bus OMRCD into two 3-bus OMRCDs, each to convey a respective nibble to/from respective memory modules On-Module Buffer-Amplifier elements in secondary RCD path

OFF-MODULE DATA BUFFER

TECHNICAL FIELD

The present disclosure relates generally to data processing and more particularly to memory systems and components thereof.

DRAWINGS

The various embodiments disclosed herein are illustrated by way of example, and not by way of limitation, in the figures of the accompanying drawings and in which like reference numerals refer to similar elements and in which:

FIG. 6 illustrates an embodiment of an off-module data buffer having dual buffer-communication interfaces and each to be coupled to contacts with a respective one of two module sockets (A and B) and thus permit buffer communication with RCD components disposed on either or both of those module sockets;

FIG. 7 illustrates an exemplary buffer-communication interconnect arrangement with respect to a two-socket, RDIMM-based memory system having off-module data buffers according to FIG. 6;

FIG. 8 illustrates an alternative modular memory system having both off-module data buffers and an off-module registered clock driver (RCD)—an arrangement that supports unregistered/unbuffered memory module populations;

DETAILED DESCRIPTION

Modular memory systems having off-module data buffers disposed in a data signaling data path between a memory controller and two or more memory-module sockets are disclosed herein in various embodiments. In a number of implementations, each off-module data buffer includes a "primary" data interface coupled point-to-point with a memory control component and two or more "secondary" data interfaces coupled point-to-point with respective memory-module sockets. Thus, all data paths coupled to the memory control component convey data from point to point, significantly improving signal integrity relative to conventional multi-drop topologies (e.g., by reducing signal reflections resulting from multi-drop stubs) and thus enabling higher end-to-end data rates (more symbols per unit time per signaling link). In a number of embodiments, multiple off-module data buffers (OMDBs) are disposed adjacent or between memory module sockets with each individual OMDB serving a respective portion of the data links extending from the data interface of a memory control component.

Memory modules supported by various off-module data buffers presented herein include, for example and without limitation, unregistered dual inline memory modules (unregistered DIMMs or UDIMMs) and registered DIMMs (RDIMMs). In a number of RDIMM system embodiments, each off-module data buffer includes a per-socket buffer-communication (BCOM) interface to receive/send signals from/to a registered clock driver chip (RCD) disposed on a given memory module and thus multiple BCOM interfaces to interact with the RCDs from each of two or more registered memory modules when present. By contrast, in UDIMM system embodiments, an off-module RCD is generally provided to drive command/address and control signals to two or more memory modules (when the system is so populated) and to output buffer-communication signals to the off-module data buffers—an arrangement that enables the off-module data buffer ICs (chips) to be implemented with a solitary BCOM interface. These and other features and embodiments are discussed in greater detail below.

Figure 1:
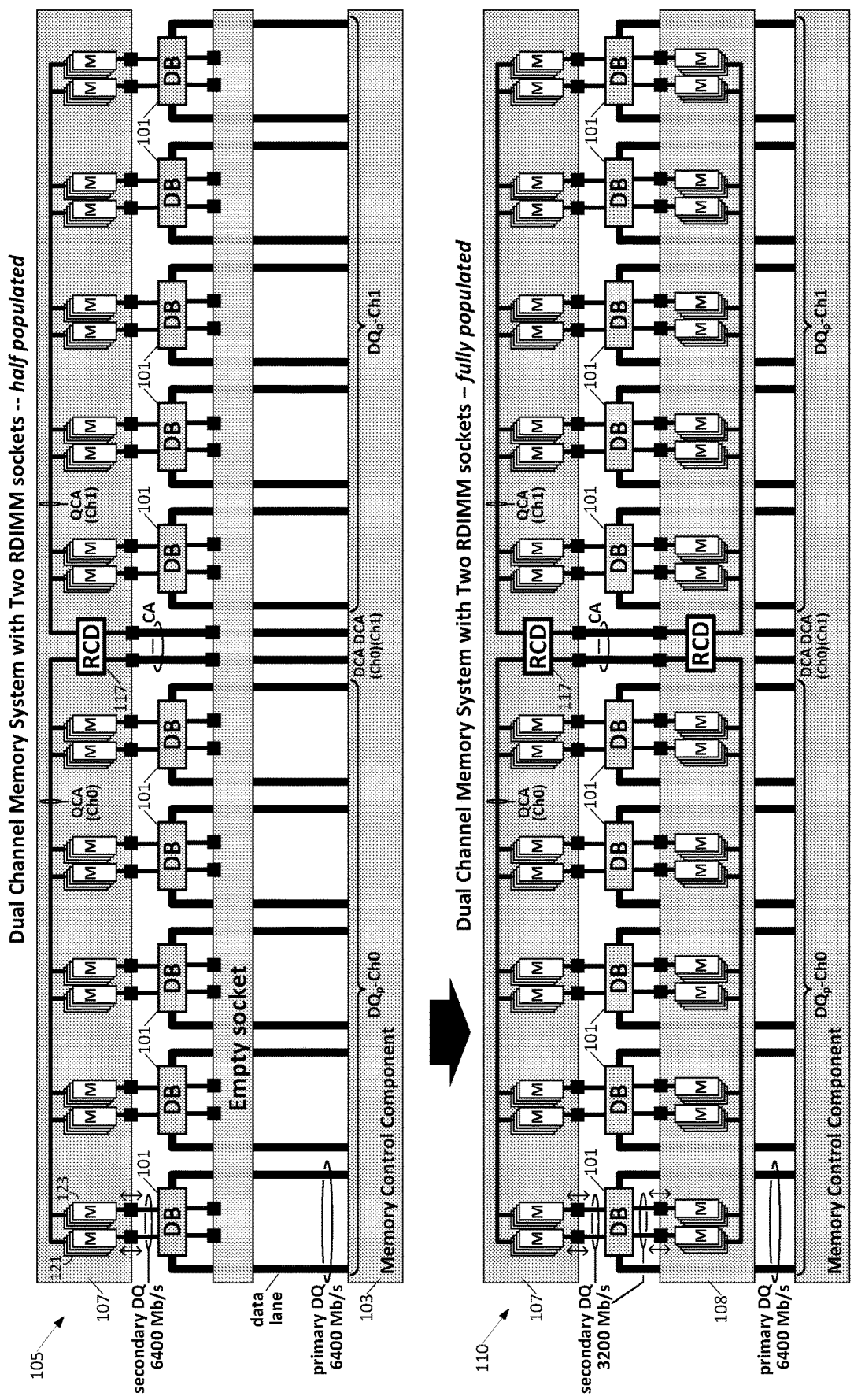
FIG. 1 illustrates an exemplary load-reduced modular memory system having off-module data buffers disposed in the data path between a memory control component and two registered dual-inline memory module (RDIMM) sockets.

FIG. 1 illustrates an exemplary load-reduced modular memory system having off-module data buffers 101 disposed in the data path between a memory control component 103 and two registered DIMM (RDIMM) sockets—presenting a half-populated system at 105 (RDIMM 107 in one socket, other socket empty) and a fully populated system at 110 (RDIMMS 107, 108). The data links (DQ) extending between memory control component 103 and module mounted memory components (M) via off-module data buffers 101 are split between two memory channels (i.e., channels 0 and 1) and command/address/control signals (CA) issued to an on-module RCD component 117 (or two RCD components when two modules are present) are likewise split between two "control" channels (Ch0, Ch1), though more or fewer data and/or control channels may be deployed in alternative embodiments.

Within each data channel, multiple sets of "primary" data links (primary DQ) are coupled point-to-point between memory control component 103 and respective off-module data buffers 101, with two sets of "secondary" data links (secondary DQ) extending from each off-module data buffer to respective 'A' and 'B' RDIMM socket contacts. By this arrangement, signals are conveyed point-to-point over the primary data links, reducing signal reflections/improving signaling integrity relative to multi-drop arrangements (i.e., in which each data link extends from a memory control component to multiple on-module data buffers, one per socket) and thus enabling potentially faster signaling rates. By contrast, each command/address (CA) and control signaling link (e.g., chip-select, clock, clock enable, on-die termination control, etc.) is coupled in a multi-drop arrangement (i.e., in parallel) with the two module sockets. In one embodiment, signaling rates over the command/address/control links are lower than those on the data links (e.g., by a factor of two or four), providing additional headroom to accommodate the multi-drop CA interconnect topology.

Still referring to FIG. 1, the primary data links extending between control component 103 and a given off-module data buffer 101 are split between low-order ("lower") and high-order ("upper") data lanes and each of the two sets of secondary data links extending between the off-module data buffer and a respective RDIMM socket are likewise split between lower and upper data lines. Within a given memory module, each constituent signaling link of the lower data lane is coupled in parallel to a first set of memory components (121), and each constituent data link of the upper data lane is coupled in parallel to a second set of memory components (123). During a memory read or write operation, chip-select signals delivered to on-module RCD 117 and forwarded by the RCD to the memory components of a given channel will select/enable a specific one of the memory components within the first set of memory components and a specific one of the memory components within the second set of memory components to receive write data from or output read data to the corresponding off-module data buffer 101 via the secondary data links. In the particular embodiment shown, each of the memory components is assumed to have a four-bit data interface, so that the upper and lower data lanes individually convey an upper nibble (four-bits) and lower nibble of data, respectively, and collectively convey a byte of data. As each memory module includes twenty (20) sets of memory components coupled to respective four-bit data lanes and split 10 sets apiece between first and second data channels, each data channel conveys 40 bits of data per bit transmission interval (i.e., $t_{BIT}$ or bit time). Additionally, in a number of embodiments, the constituent memory components of a given set coupled in common to a data lane are disposed in sufficiently close proximity to enable secondary signaling rates that match those on the primary data links—in this example at 6400 Mb/s per data link ($t_{BIT}$=156.25 picosecond). In a number of embodiments, for example, the memory components within a given set are sufficiently proximal (e.g., physically stacked in a three-dimensional die stack, disposed in part on opposite sides of a relatively thin module substrate, etc.) to enable termination elements distributed within two or more of the memory components to effect a lumped link termination of the subject data lane (e.g., to match secondary link impedance and thus limit signal reflection) and/or to enable termination element(s) within any one or more of the memory components (or other integrated circuit die within a die stack or other multi-die arrangement) to effect a link termination for set of memory components as a whole.

In general, each primary control channel (DCA-Ch0 and DCA-Ch1) conveys command/address and control signals—including the aforementioned chip-select signals—that are forwarded by on-module RCD 117 over a corresponding secondary control channel (QCA-Ch0, QCA-Ch1) to control interfaces of individual memory components. In addition to command/address signals that indicate row operations (e.g., bank/row-address specified activation, precharge and refresh in the case of dynamic random access memory (DRAM) components) and column operations (e.g., bank/column-address specified data read or write within a column of an activated data page in a DRAM component), command signals may specify, for example and without limitation, various timing calibration operations (e.g., data receive and transmit operations within the DRAM components to enable the control component to adjust controller-internal transmit and receive timing domains for alignment with drifting timing domains within respective memory components), storage of various programming values (e.g., termination values to be applied by memory components) and system configuration information. Likewise, in addition to control signals that enable row and column operations within specific groups of memory components (e.g., chip-select signals that select one of N ranks of memory components to respond to a given command/address such that constituent memory components of the rank are operated in lock-step/parallel with respect to memory access operations) and provide timing (e.g., forwarded system clock that establishes timing domains within individual memory components), the control signals supplied by the control component and forwarded to the memory components may convey various information to transition the memory system (RCD components and/or memory components) between hierarchical power-reduction states, control one-die termination application/timing and so forth. Also, while the RCD component is generally described herein as forwarding command/address/control signals received from the memory control component, the RCD component may, in all cases, carry out decoding operations or otherwise derive or supplement command/address/control signals (to be output to the memory components) in response to those supplied by the memory control component.

Like the command/address/control signals, the data signals output from or received by the memory control component generally include a diversity of signal types, including data signals bearing information received from or to be returned to a processor or other host functional component (i.e., "data per se"), "EDC" data signals bearing error detection/correction (EDC) information, data timing signals indicating a sampling instant within each bit interval and, in the case of a data strobe signal (DQS), intervals in which valid data is being conveyed over one or more data signaling links to which the data strobe signal corresponds. As discussed below, joint-access transactions enabled by the off-module data buffers (i.e., accessing two or more memory modules in a single memory transaction) may allow increased EDC/data-per-se ratio relative to conventional systems.

Figure 2:
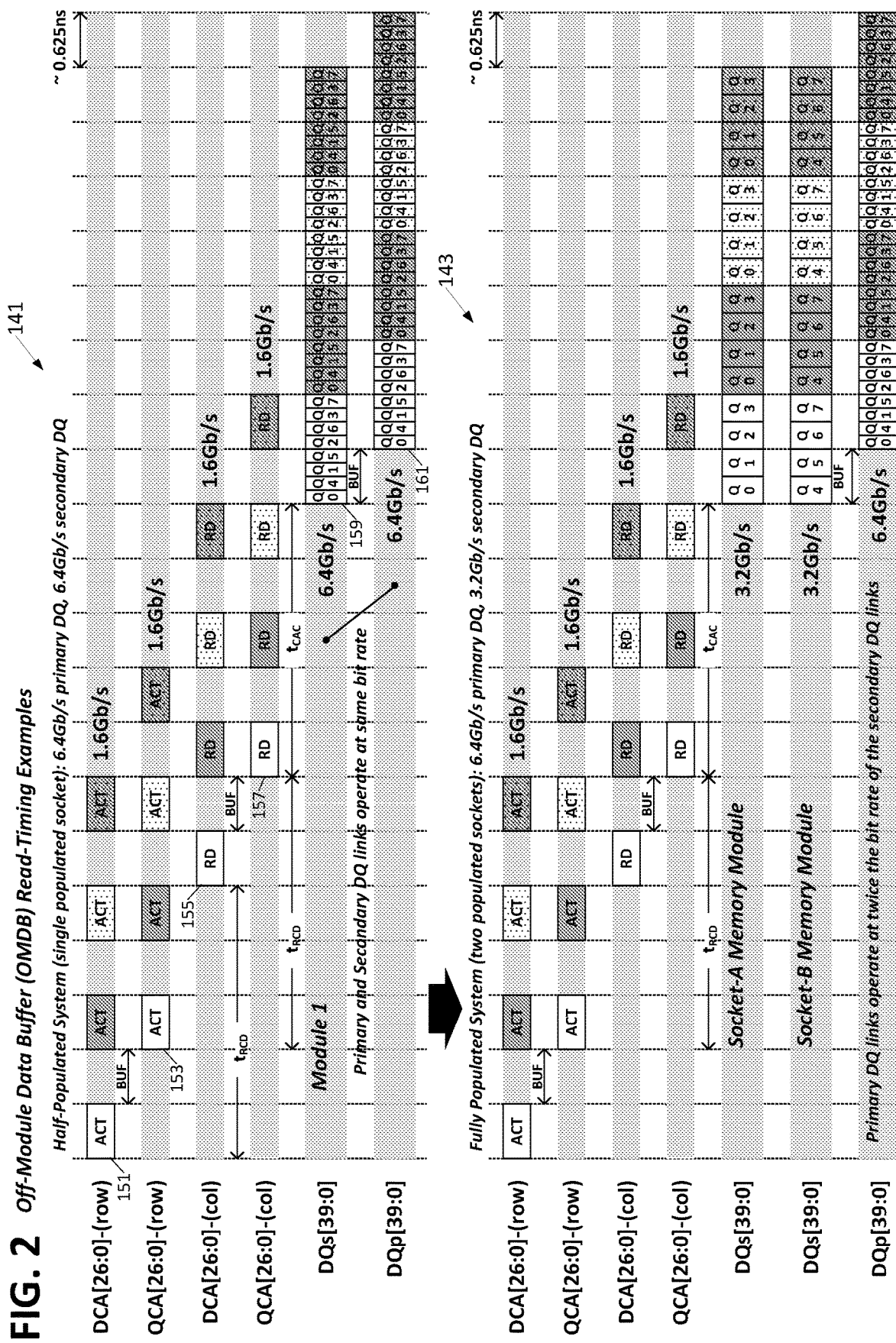
FIG. 2 is a timing diagram illustrating exemplary timing relationships between operational signals (command/address and control) and data signals conveyed on the primary and secondary signaling links within the memory system of FIG. 1.

FIG. 2 is a timing diagram illustrating exemplary timing relationships between operational signals (command/address and control) and data signals conveyed on the primary and secondary signaling links within the memory system embodiment of FIG. 1—showing timing for a half-populated system at 141 and for a fully-populated system at 143 and assuming DRAM memory access transactions (row activation followed by column access) in each case.

Starting with the half-populated system timing at 141, a 1.6 GHz system clock forwarded from the memory control component to the memory components via on-module RCD components establishes a 0.625 nanosecond-per-cycle system clock domain within each of the memory components and RCD components. In a number of embodiments, the system clock domain is mesochronous as between different system components—having, on average, the same frequency in all components but arbitrary and time-varying phase relation from component to component due to link propagation delay and component-internal temperature/voltage drift, process variation, etc. These mesochronous relations are not specifically shown in FIG. 2, with uniform system clock boundaries applying with respect to all signals within a given group. Thus, the memory control component drives a set of operational signals (DCA[26:0]) onto the primary command/address/control links at 151 to initiate an activation operation (ACT) within a selected rank of memory components and the RCD forwards those signals (and/or derivatives thereof) to the memory components on the secondary command/address/control links at 153, after a one cycle buffer delay ("BUF" or $t_{BUF}$). A predetermined time ($t_{RCD}$) after transmitting row-operation signals DCA [26:0], the memory control component outputs column-operation signals corresponding to a read operation ("RD") on the primary command/address/control links (155), commanding a memory read operation within an address-specified column of the activated bank and row. The RCD component receives the incoming read command (and associated address and control signals) and, after a $t_{BUF}$ delay, forwards the read command to the memory control components (157) via the secondary command/address/control links.

Still referring to FIG. 2, the memory components respond to the incoming activation and memory read commands by executing a row activation (at address-specified row and bank within chip-select specified rank of memory components) and column read operation at relative times according to the arrival of the corresponding row and column commands via the secondary command/address/control links. As part of the column read operation, the chip-selected memory components retrieve an address-specified column of data from an open data page (generally stored within a sense amplifier bank) and then transmit the accessed/retrieved data in a serial burst on the secondary data links (159) a predetermined time ($t_{CAC}$) after reception of the column read command. In the 6.4 Gb/s/link example depicted, four data bits are transmitted sequentially per 0.625 ns clock cycle on each of 40 secondary data links (i.e., $t_{BIT}$=0.156 ns) over a two-cycle burst interval (i.e., 8-bit burst). The burst order is alternated between high-order and low nibbles of a serial byte (i.e., bits Q0-Q3 interleaved with bits Q4-Q7), though various other burst orders may be implemented. The off-module data buffer re-transmits the inbound data bits (i.e., arriving on each secondary data link) one buffer interval later (161) on the primary data links, thus forwarding the data burst to the memory control component at the same 6.4 Gb/s rate. A sequence of transactions follows the operation initiated at 151 to maintain continuous data transmission on the primary and secondary data paths (i.e., demonstrating peak data rate), with the component signals relating to each transaction shaded/hashed to show correspondence.

Turning now to timing diagram 151 for a fully-populated memory system (two memory modules in this example), control signal timing over the primary and secondary command/address/control links is identical to the half-populated example, but the signaling rate over the secondary data path is relaxed by a factor of two. More specifically, memory components on each of the socket-A and socket-B memory modules are selected/enabled to respond to the row activation and memory read commands simultaneously and the resulting half-rate data signals transmitted by the memory components on each module (i.e., at 3.2 Gb/s per secondary link) are merged by the off-module data buffers to yield full-rate (6.4 Gb/s) data transmission on the primary data links to the memory control component. That is, each primary data link is operated (conveys data) at twice the bit rate of any single secondary data link, with a respective pair of secondary data links feeding data to (or, in the case of a memory write, drawing data from) a given primary data link.

In contrast to legacy approaches in which parallel stubs to fully populated module sockets tend to degrade signaling integrity and curtail signaling rates, the off-module data buffers enable attached memory modules to transmit and receive data at a maximum bandwidth (e.g., 6.4 Gb/s per point-to-point link in the depicted example). Moreover, the relaxed data signaling rate on the secondary memory components enables application of less expensive memory components having lower maximum signaling rates than that of the primary data links—for example, lower-speed-yield components (slow process corner bin), or older products that conform to legacy standards or signaling rates.

Figure 3:
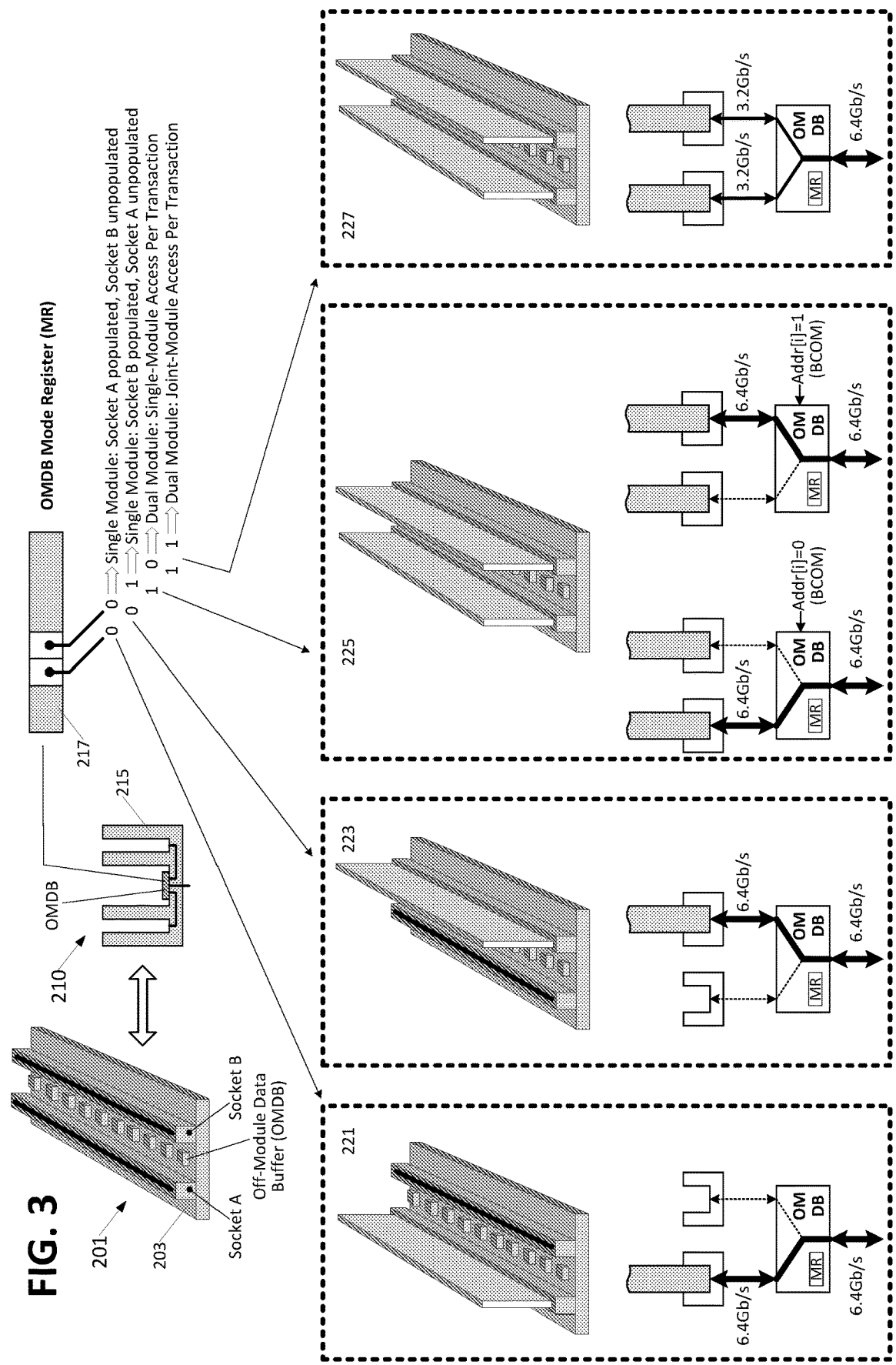
FIG. 3 illustrates an exemplary physical disposition of off-module data buffers between 'A' and 'B' memory module sockets.

FIG. 3 illustrates an exemplary physical disposition of off-module data buffers between 'A' and 'B' memory module sockets. In an embodiment shown at 201, the off-module data buffers are mounted to a mother board 203 or other system-scale printed circuit board and coupled to contacts within the module sockets (also mounted on the motherboard) via wire traces formed on one or more motherboard layers. In a more integrated embodiment shown at 210, the off-module data buffers are disposed on a multi-socket assembly 215 or integrally formed component itself intended for mounting to a system-scale circuit board. In the depicted example, module sockets, off-module data buffer landings (contact pads) and wired interconnects between the landings and socket contacts are implemented in an integrated product (e.g., 215) and completed by mounting of off-module data buffer components on the landings. In that case, primary data links extend from the data-buffer landings (contacts) to an interconnect point at the underside of the integrated unit (217), while secondary data links extend from another set of data-buffer landings to contacts within the module socket/receptacles (219). Command/address/control links, not specifically shown, extend from the underside of integrated unit 215 to contacts within each of the module sockets. In embodiments intended for population with registered memory modules (e.g., RDIMMs), buffer communication paths may extend from socket contacts through interconnects within or over a surface of the integrated unit to the on-module data buffers to enable RCD to data buffer communication—a topic discussed in greater detail below.

In a number of embodiments, each off-module data buffer comprises a programmable mode register having a field to hold a multi-bit population descriptor value indicative of module population and access type. In the exemplary mode register shown at 217, a two-bit population descriptor value indicates which of the two memory sockets are populated with memory modules (A, B or both) and, where both sockets are populated, whether the modules are individually or jointly accessed in connection with a given memory transaction (memory read or write). In a number of embodiments, the off-module data buffer responds to single module configuration modes (i.e., population descriptor indicates that either socket 'A' or socket 'B' is unoccupied) by disabling timing signal distribution to and/or otherwise disabling circuit components relating to the unused secondary interface (e.g., as illustrated conceptionally by the dashed lines extending to the unoccupied DIMM socket in single-module examples 221, 223) to conserve power. In the case of a dual-module configuration with single-module access per transaction (225), memory access operations are carried out with respect to individual modules (i.e., one module or the other) as indicated by chip-select and/or address signals issued by the memory control component and forwarded by the RCD. in the dual-module/joint-access configuration (227), each memory transaction is split between the two installed memory modules, enabling half-rate transmission over the secondary data links that collectively match the full-rate data transmission over the primary data links (e.g., 6.4 Gb/s primary and dual 3.2 Gb/s secondaries as shown).

Figure 4:
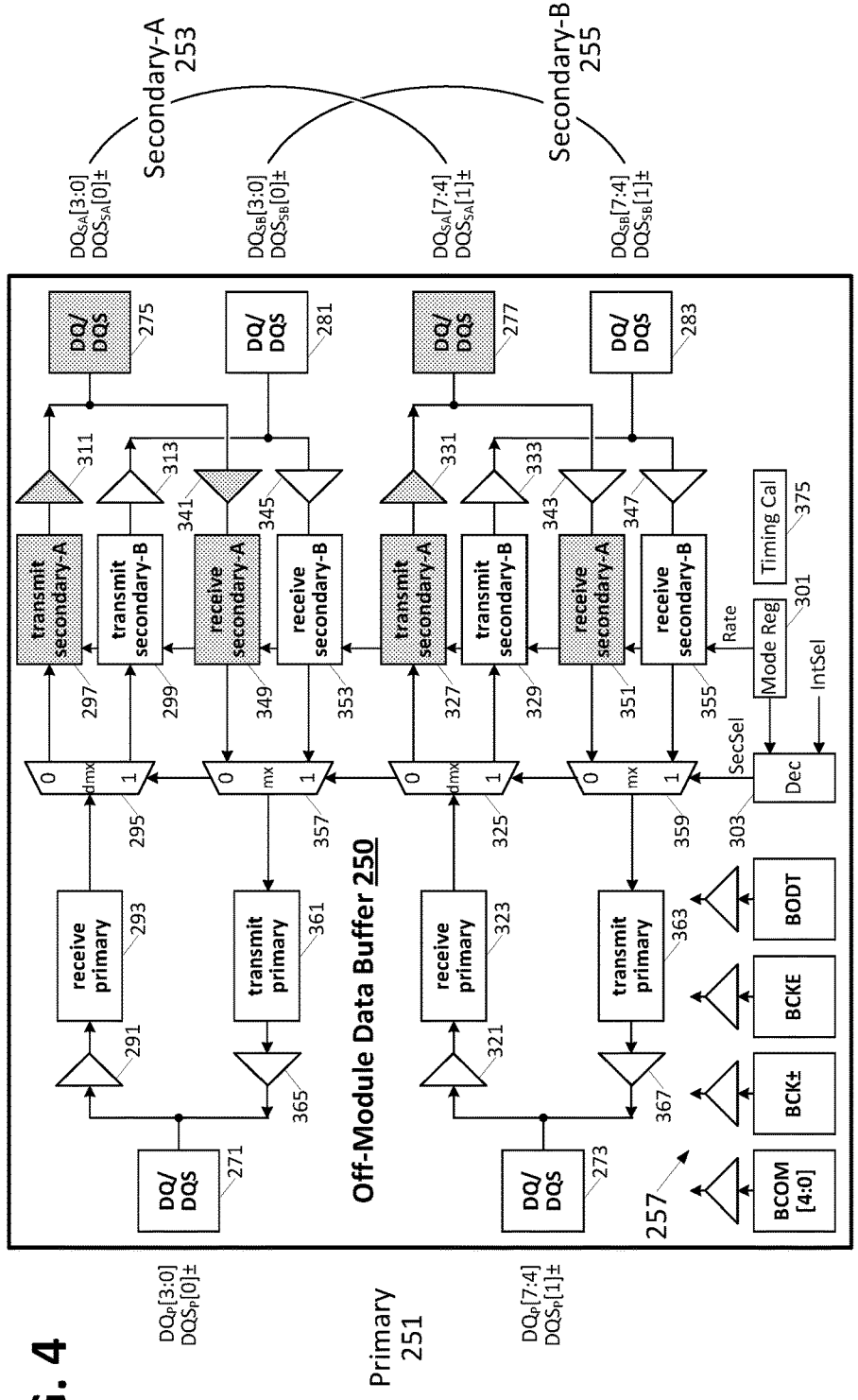
FIG. 4 illustrates an embodiment of an off-module data buffer having a byte-wide primary data interface, two byte-wide secondary data interfaces, and a buffer-communication (BCOM) interface.

FIG. 4 illustrates an embodiment of an off-module data buffer 250 having a byte-wide primary data interface 251, two byte-wide secondary data interfaces 253, 255, and a buffer-communication (BCOM) interface 257. Each byte-wide data interface (primary, secondary-A and secondary-B) is implemented by a pair of 4-bit data interfaces (upper and lower nibbles of a parallel byte of data—in contradistinction to upper and lower nibbles of a serial data burst) and two timing signal interfaces, one timing signal interface per 4-bit data interface. In the particular embodiment shown, the data interfaces (DQ) implement bi-directional single-ended data transmission/reception, while the timing interfaces (DQS) implement bidirectional differential strobe signaling—a total of 12 signal line contacts (8 single-ended data, 2 differential strobes) per interface, with each 4-bit data interface and corresponding timing signal interface shown as a single contact, for simplicity (i.e., 271/273, 275/277, 281/283). Various alternatives may be implemented with respect to signaling direction (separate data paths and/or timing signal paths may be provided for inbound and outbound data), numbers of links (or data/timing link ratio) and/or wires per link (differential, pseudo-differential, single-ended, etc.).

Still referring to FIG. 4, the propagation paths of the low-order and high-order nibbles between primary and secondary data interfaces are symmetric (identically implemented). In the data-write path (i.e., data conveyed from primary to one or both secondary interfaces), the low-order nibble is received via the primary interface at contacts 271, conditioning buffer 291 and primary sampling (receive) circuitry 293, and output from the sampling circuitry to demultiplexer 295. Depending on the state of a secondary-select signal (SecSel), demultiplexer 295 forwards the write-data nibble recovered (and output) by sampling circuitry 293 during each bit interval ($t_{BIT}$) to the low-order transmit circuitry for either secondary A or secondary B—either to transmit circuitry 297 or 299. In the case of a single-module population—as indicated by a configuration value recorded within mode register 301 and output to decoder 303 to generate the secondary-select signal—SecSel remains at steady state throughout an incoming data burst (i.e., primary-side reception of nibble after nibble within sampling circuit 293 in respective and successive $t_{BIT}$ intervals) to forward the sequence of nibbles to either the secondary-A or secondary-B transmit circuit (297, 299) in accordance with the populated memory socket. In that case, the mode-register 301 outputs a rate signal ("Rate") to the secondary transmit and receive circuits indicating full-rate secondary data transmission and reception (i.e., signaling rate at secondary matches that of primary) and the recipient transmit circuit 297 or 299) transmits the incoming nibble and corresponding timing strobe via signal driver 311 or 313 and output contacts 275 or 281, as the case may be. The decoder 303 (or mode register) may also output a signal to disable clocking within the secondary transmit and receive circuits corresponding to the unoccupied module socket (or otherwise render those circuits to a reduced-power or powered-down state). Write data flow in the high-order nibble path (i.e., via contacts 273, amplifier/conditioner 321, sampling circuit 323, demultiplexer 325, secondary transmit circuits 327 and/or 329 (and drivers 331, 333 to contacts 277 and/or 283) is identical to that in the low-order nibble path.

In the case of a dual-module population with single access per transaction (i.e., as indicated by a setting within mode register 301), decoder 303 responds to an interface select signal (IntSel) supplied, for example, via the buffer communication interface (e.g., as bit BCOM[4]), by setting the secondary-select signal state prior to the start of the data burst for each newly commanded write or read transaction. In a number of embodiments, for example, an RCD component receives command/address/control signals indicating a requested memory transaction within the socket-A or socket-B memory module and outputs the interface select signal to the off-module data buffers via BCOM[4]. Decoder circuit 303 responsively sets the secondary-select signal to route data to/from secondary-A or secondary-B throughout the data burst interval for the requested memory transaction.

Figure 5B:
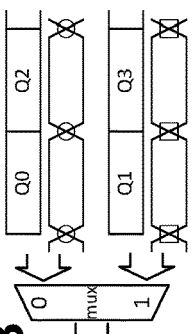
FIGS. 5A and 5B illustrate exemplary demultiplexing and multiplexing of write and read data streams, respectively, within the off-module data buffer of FIG. 4.
Figure 5A:
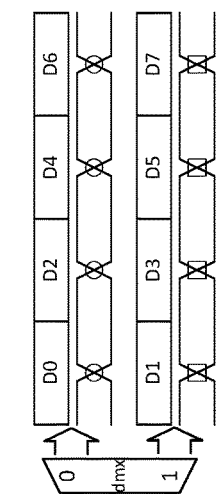

If mode register 301 indicates a dual-module population with joint access per transaction, decoder 303 toggles the secondary-select signal between secondary-A and secondary-B settings at the primary data rate, thus routing successive nibbles of a write data burst alternately to the secondary-A and secondary-B data transmit circuits 297, 299 via demultiplexer 295. An example of this data splitting (and timing signal splitting) operation is shown in FIG. 5A. That is, SecSel changes state at the leading edge of each data element (i.e., D0, D1, D2 . . . D7) to route those data elements and their corresponding timing edges within the incoming strobe signal (DQS) alternately to the secondary-A and secondary-B transmit circuits. Thus, evenly numbered data elements D0, D2, D4, D6 and corresponding strobe signal edges (circled edges) are routed via demultiplexer 295 to the secondary-A transmit circuit 297, while odd-numbered data elements D1, D3, D5, D7 and corresponding strobe signal edges (marked by squares) are routed to the secondary-B transmit circuit 299. By this arrangement, the inbound data rate (and thus the transmit data rate) at either of the secondary transmit circuits 297, 299 is half that at the primary receive circuit 293—and the corresponding strobe signal edge rate is likewise halved. Thus, the data transmission rate (data output rate and strobe signal transition rate) at each individual secondary interface (A or B) is half the data reception rate at the primary interface, while the collective data transmission rate of the two secondary interfaces matches the data reception rate at the primary interface. As discussed above, this relaxed (halved) secondary data rate permits use of lower cost memory components and memory modules without compromising data throughput (i.e., data rate maximum set by primary interface is maintained).

Read data routing through the off-module data buffer of FIG. 4 is essentially the reverse of write data routing. That is, in a single-module population, read data received via one secondary interface or the other (i.e., via contacts 275/277 or 281/283, signal conditioners 341/343 or 345/347, and sampling circuits 349/351 or 353/355) is forwarded via multiplexer 357 or 359 to data transmission circuitry (transmit circuits 361/363, amplifiers 365/367, contacts 271/273) within the primary data interface in accordance with a steady-state secondary-select signal. In a dual-module, single-module-access per transaction configuration, read data is likewise received via one secondary interface or the other and forwarded via multiplexer 357 or 359 to the primary-interface transmission circuitry—in that case, with the secondary-select signal switching states arbitrarily in accordance with the accessed memory module. In both those cases (single-module or dual-module, single-module-access per transaction), the primary and secondary data interfaces operate at the same signaling rate. In a dual-module/joint-access configuration, by contrast, half-rate read data (and half-rate read strobe signals) is received via each of the secondary interfaces and merged via multiplexers 357 and 359 into a full-rate primary data stream and strobe signal. This operation is shown, for example, in FIG. 5B, emphasizing the concentration (merging) of read strobe edges by marking those sourced by (corresponding to) the secondary-A and secondary-B interfaces by circles and squares, respectively. Note that the secondary read data streams may be staggered in time (e.g., offset by the primary-interface bit time, $t_{BIT}$) rather than arriving in nominal edge alignment as shown. The secondary write data streams shown in FIG. 5A may likewise be staggered in time.

Still referring to FIG. 4, a timing calibration circuit 375 may be provided to enable per-pin or per-nibble timing phase adjustment of the primary and/or secondary interfaces in accordance with commands received via buffer communication interface 257. The buffer communication interface itself includes a multi-bit command interface (BCOM[4:0] contacts—at least one bit of which may be dedicated to conveyance of interface select signal IntSel, a system clock and clock-enable inputs (BCK and BCKE contact) and on-die termination (ODT) control input (BODT)

FIG. 6 illustrates an embodiment of an off-module data buffer 401 having dual buffer-communication interfaces 403 and 405 each to be coupled to contacts with a respective one of two module sockets (A and B) and thus permit buffer communication with RCD components disposed on either or both of those module sockets. The low-order and high-order nibble interfaces (i.e., DQ[3:0] and DQ[4:7], respectively, within the primary and secondary-A and Secondary-B interfaces) and internal transmit, receive, multiplexing and demultiplexing circuits therefor are implemented as discussed in reference to FIGS. 4, 5A and 5B. Mode register 407 and secondary-select decoder 409 are likewise implemented and operate as discussed in reference to FIG. 4, with the value stored in the mode register value and the interface-select signal being supplied by programmably selectable sources. That is, values programmed within the mode register (and commands to effect such programming) may be received via the socket-A buffer communication interface or the socket-B buffer communication interface, depending on memory module population.

FIG. 7 illustrates an exemplary buffer-communication interconnect arrangement with respect to a two-socket, RDIMM-based memory system having off-module data buffers according to FIG. 6. Referring first to the buffer-communication wiring shown at 451, the buffer communication interfaces within each of the off-module data buffers corresponding to a given memory channel (ch0 or ch1) are coupled via buffer communication buses (e.g., $453_0/453_1$, $455_0/455_1$) to RCD buffer communication contacts within the corresponding socket (A or B). By this arrangement, when socket A is populated and socket B is empty (unoccupied), as shown at 461, the socket-A buffer communication interface may be enabled to receive buffer communication signals that control the primary-to-secondary data routing within the host off-module data buffer and to enable timely (including timing-calibrated) write and read data reception in accordance with memory access commands received within the socket-A RCD component. Though not specifically shown, the converse operation is effected via the socket-B buffer communication interface when socket B is populated and socket A is empty. In either of those cases, the appropriate buffer communication interface may be enabled either through control signals issued to the off-module data buffer (e.g., through the buffer communication interface coupled to the resident memory module) or through detection of the module population arrangement by or default operation of the off-module data buffer itself (e.g., strapping, default-programming, etc.)

Still referring to FIG. 7, when two memory modules are present as shown at 471—that is, two RDIMMs each having an RCD coupled via socket contacts to a respective one of the two BCOM interfaces within each off-module data buffer—the off-module data buffers operate in a split-control mode with respect to functions that are specific to either the A or B secondary interfaces. For example, timing calibration operations with respect to secondary data interfaces A and B may be controlled, respectively, via buffer communication interfaces A and B (and thus by the socket-A and socket-B RCD components, respectively). For operations in which a single-control source is preferable or required (e.g., mode register programming, Interface-Select signal delivery, primary-interface timing calibration, etc.), a default or arbitrated one of the A and B buffer communication interfaces may serve as that control source. In one embodiment, for example, the socket-A buffer communication interface (and thus the socket-A memory module) is the default source of single-source control signals—an arrangement that may be overridden through mode register programming or other arbitration approaches.

FIG. 8 illustrates an alternative modular memory system 500 having both off-module data buffers and an off-module registered clock driver 501—an arrangement that supports unregistered/unbuffered memory module populations—memory modules lacking on-module RCD and data buffer components and referred to herein as unregistered memory modules (UDIMMs in the case of dual inline memory modules). As in the embodiment of FIG. 1, the data links between the memory control component 503 and off-module data buffers 511 are split between two data channels (Ch0 and Ch1) and command/address/control signals issued to off-module RCD component 501 are likewise split between two "control" channels, though more or fewer data and/or control channels may be deployed in alternative embodiments.

Within each data channel, a set of "primary" data links are coupled point-to-point between the memory control component and respective off-module data buffers, with two sets of "secondary" data links extending from the off-module data buffers to respective 'A' and 'B' UDIMM sockets. Accordingly, as in FIG. 1, data signals are conveyed point-to-point over the primary data links, reducing signal reflections/improving signaling integrity relative to multi-drop arrangements (i.e., in which each data link extends from a memory control component to multiple on-module data buffers, one per socket) and thus enabling faster signaling rates.

The "primary" command/address/control signaling links are also coupled point-to-point with a primary interface of off-module RCD component 501, with two sets of secondary command/address/control links extending from secondary interfaces of the off-module RCD to respective sets of contacts within the A and B module sockets. Also, though not specifically shown, off-module RCD component 501 includes a buffer communication interface coupled via off-module signal traces to buffer communication interfaces within off-module data buffers 511.

As in the embodiment of FIG. 1, the primary data links extending between the memory control component and a given off-module data buffer are split between low-order ("lower") and high-order ("upper") data lanes and each of the two sets of secondary data links extending between the off-module data buffer and a respective UDIMM socket are likewise split between lower and upper data lines. Within a given memory module, each constituent signaling link of the lower data lane is coupled in parallel to a first set of memory components, and each constituent data link of the upper data lane is coupled in parallel to a second set of memory components. During a memory read or write operation, chip-select signals delivered to the off-module RCD and forwarded to the memory components disposed on one or both memory modules (i.e., depending on module population and whether joint-module access is enabled) will select/enable a specific one of the memory components within the first set of memory components and a specific one of the memory components within the second set of memory components to receive write data from or output read data to the corresponding off-module data buffer via the secondary data links. For purposes of example only, the same data interface sizes discussed in reference to FIG. 1 are carried forward in the UDIMM system of FIG. 8 so that the upper and lower data lanes individually convey an upper nibble (four-bits) and lower nibble of data, respectively, and collectively convey a byte of data. As each memory module includes twenty (20) sets of memory components coupled to respective four-bit data lanes, and split between first and second data channels, each data channel conveys 40 bits of data per bit transmission interval (i.e., $t_{BIT}$ or bit time). As before, constituent memory components of a given set coupled in common to a data lane may be disposed in sufficiently close proximity to enable secondary signaling rates that match those on the primary data links (e.g., 6400 Mb/s per data link; $t_{BIT}$=156.25 picosecond).

In general, each primary control channel (DCA-Ch0, DCA-Ch1) conveys command/address and control signals—including the aforementioned chip-select signals—that are forwarded by the off-module RCD to one or both memory modules over respective secondary control channels dedicated to those memory modules (i.e., QCA-Ch0, QCA-Ch1 dedicated to socket A and QCA-Ch0, QCA-Ch1 dedicated to socket B). The secondary control channels extending to a given module are coupled via on-module signal lines to control interfaces of individual memory components that form the channel-0 and channel-1 memory groups. In addition to command/address signals that indicate row operations (e.g., bank/row-address specified activation, precharge and refresh in the case of dynamic random access memory (DRAM) components) and column operations (e.g., bank/column-address specified data read or write within a column of an activated data page in a DRAM component), command signals may specify various timing calibration operations (e.g., data receive and transmit operations within the DRAM components to enable the control component to adjust controller-internal transmit and receive timing domains for alignment with drifting timing domains within respective memory components), storage of various programming values (e.g., termination values to be applied by memory components) and system configuration information. Likewise, in addition to control signals that enable row and column operations within specific groups of memory components (e.g., one of N ranks of memory components, with the components of each rank being selected by a given chip-select signal such that constituent memory components of the rank are operated in lock-step/parallel with respect to memory read and write operations) and provide timing (e.g., forwarded system clock that establishes timing domains within individual memory components), the control signals supplied by memory control component 503 and forwarded to the memory components may convey various information to transition the memory system (RCD components and/or memory components) between hierarchical power-reduction states, control one-die termination application, effect timing calibration, program mode registers, etc. Also, while off-module RCD 501 is generally described herein as forwarding command/address/control signals received from the memory control component, the RCD component may carry out decoding operations or otherwise generate command/address/control signals (to be output to the memory components via secondary control channels) in response to those supplied by the memory control component.

Like the command/address/control signals, the data signals output from or received by memory control component 503 generally include a diversity of signal types, including data signals bearing information received from or to be returned to a processor or other host functional component (i.e., "data per se"), "EDC" data signals bearing error detection/correction (EDC) information, data timing signals indicating a sampling instant within each bit interval and, in the case of a data strobe signal (DQS), intervals in which valid data is being conveyed over one or more data signaling links to which the data strobe signal corresponds.

Figure 9:
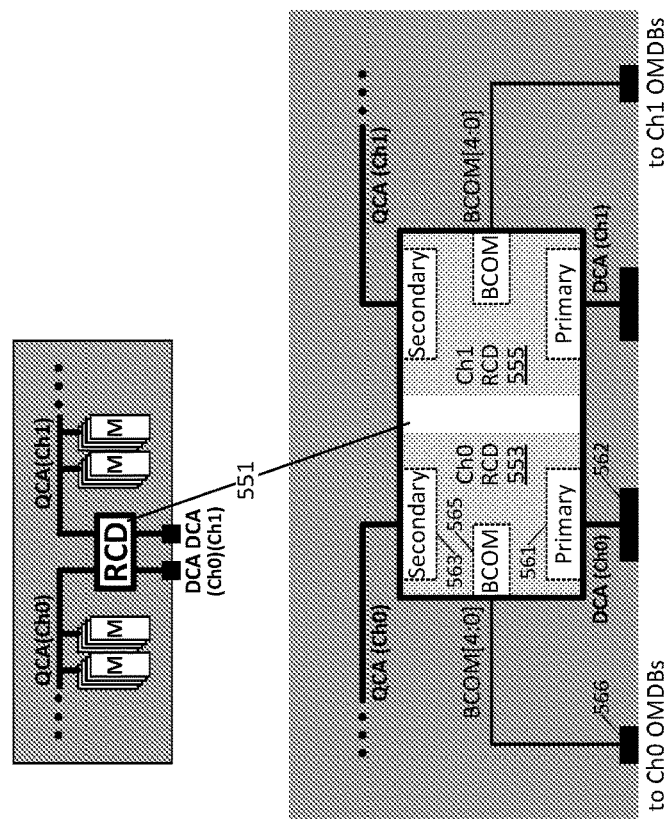
FIG. 9 illustrates an embodiment of an on-module RCD that may be deployed in a modular memory system with off-module data buffers.

FIG. 9 illustrates an embodiment of an on-module RCD 551 that may be deployed in a modular memory system with off-module data buffers. In the implementation shown, the RCD includes symmetric registered clock driver functions 553 and 555 for memory channels Ch0 and Ch1, respectively (more or fewer channels may be supported in alternative embodiments). Referring to the Channel-0 RCD 553, command/address/control signals (i.e., command signals, address signals, clock and clock-enable signals, on-die termination signals, chip-select signals, etc.) are received from a memory control component via a primary interface 561 (i.e., interface coupled to module contacts 562) and re-directed to on-module memory components via secondary interface 563. A buffer communication interface 565 is provided to drive buffer control signals to off-module data buffers (i.e., via module contacts 566), including buffer-command signals indicative of memory read and write transactions (i.e., establishing data conveyance intervals within the off-module data buffers), on-die termination signals, system clock and clock enable signals (e.g., BCK and BCKE). In one embodiment, the buffer-command signals include an additional bit (e.g., BCOM[4]) to indicate which of multiple secondary data interfaces within each off-module data buffer is to participate in a given memory access transaction (e.g., supply the interface-select (IntSel) signal shown in FIG. 4 or information from which the IntSel signal is to be derived). The buffer-command signals may also convey values to be programmed within respective mode-registers of the off-module data buffers (as well as commands to execute such programming operations), including values indicative of the module-socket population, whether to perform a single-module or dual-module access per memory transaction, and, in the case of a merged transaction, information indicative of data ordering (e.g., lead with socket A data or socket B data). In yet other embodiments, information otherwise described as programmed within mode registers of the off-module data buffers may be delivered to the off-module data buffers via the buffer communication path on a per-transaction basis (i.e., instead of or in addition to mode register programming within the off-module data buffers).

Figure 10:
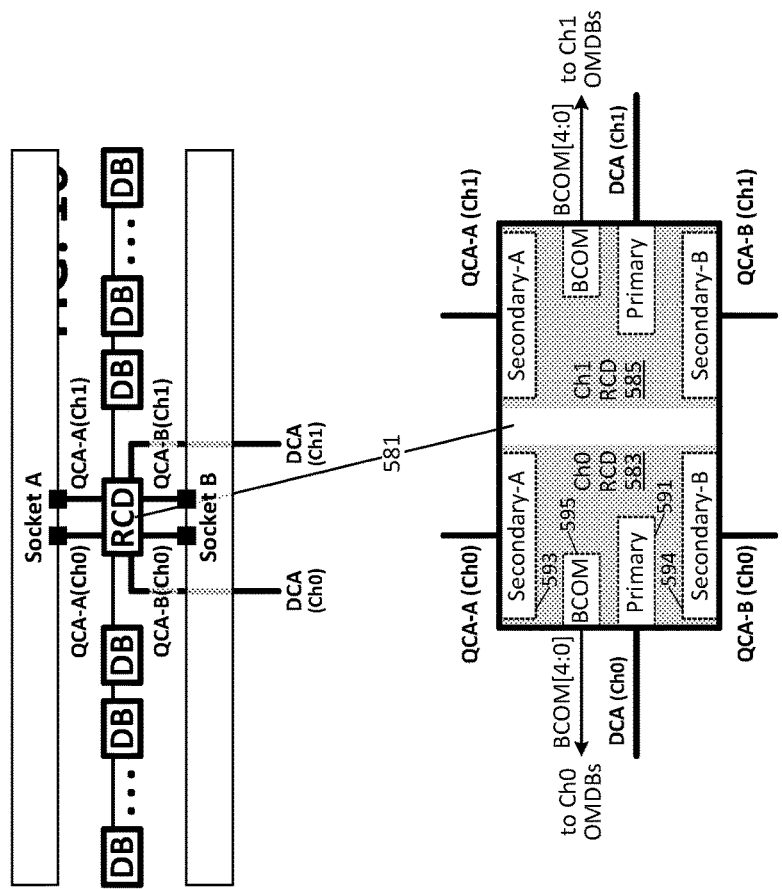
FIG. 10 illustrates an embodiment of an off-module RCD component that may be deployed within a modular memory system together with off-module data buffers.

FIG. 10 illustrates an embodiment of an off-module RCD component 581 that may be deployed within a modular memory system together with off-module data buffers. As in the on-module RCD of FIG. 9, circuitry within off-module RCD 581 is split symmetrically between memory channels Ch0 and Ch1, though more or fewer memory channels may be supported. Command/address/control signals arriving at primary interface 591 are routed to one or both of A and B secondary interfaces (593, 594) in accordance with incoming control signals and/or preprogrammed values indicative of module population and single/joint access mode. In one embodiment, for example, a multi-bit interface mode value is programmed within an on-chip mode register of RCD component 581 (not specifically shown—there may be a separate mode register for each memory channel, or a single shared mode register) to specify one of multiple possible sources of an interface-select signal to be forwarded to off-module data buffers via the buffer-communication interface 595 (i.e., to control the socket-A/socket-B access during a given memory transaction or sub-interval thereof). Where one or more incoming command/address/control signal(s) are to serve as the interface-select signal source, the interface mode value may specify a particular one of those signals (e.g., any one of multiple chip-select signals or any one of multiple address signals). Further, a lookup table (LUT) may be provided to store a programmable interface selection bit (within the LUT) corresponding, for example, to each memory bank of each memory rank, thus enabling a pre-programmed interface-select signal to be delivered to the off-module data buffers in accordance with the memory rank and memory rank being accessed (or with finer or coarser address granularity). In yet other embodiments, the interface-selection signal may be delivered to the RCD component via a dedicated pin (e.g., enabling the interface-selection to be specified per transaction) and the value stored within the interface mode register may likewise be delivered via one or more dedicated pins.

Figure 11:
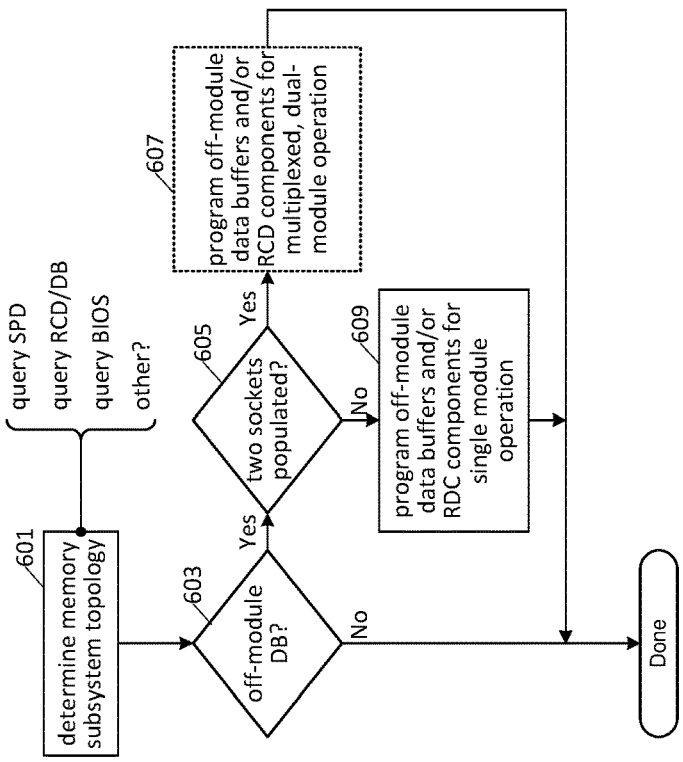
FIG. 11 illustrates a process implemented within computing device to detect and configure memory systems having off-module data buffers.

FIG. 11 illustrates a process implemented within a computing device to detect and configure memory systems having off-module data buffers. The computing device may be any type of apparatus, system, appliance or component that performs a data processing operation (e.g., laptop computer, network appliance, mobile phone, etc.) and the depicted process may be executed in whole or part by a processing entity within the computing device—that is, one or more processors or other control components, including the various memory control components discussed above. Starting at 601, the processing entity determines the memory subsystem topology, querying a serial presence device (SPD) expected to be present on any installed memory module, querying one or more on-module or off-module RCD components, performing signaling operations with respect to off-module data buffers (i.e., to ascertain their presence or configuration), retrieving system configuration information from a BIOS (basic input/output system) storage device or, more generally, carrying out any action to ascertain memory topology information. The topology information itself may indicate, for example, and without limitation, which of multiple memory module sockets is populated with a memory module, whether the memory subsystem contains off-module data buffers, signaling rate ceilings of off-module data buffers and on-module memory components (including different signaling rate ceilings that may apply with respect to joint-module access modes versus single-module access modes), whether the memory subsystem contains off-module RCD component(s), etc. If the memory subsystem contains off-module data buffers and two or more populated module sockets (i.e., all sockets populated in a two-socket system)—affirmative determinations at 603 and 605—then the processing entity optionally issues instructions to the memory control component to program the off-module data buffers and/or RCD components for multiplexed joint-access operation at 607 (e.g., as shown at 143 in FIG. 2). Otherwise, if only a single socket is populated or singular-module access is desired (i.e., despite presence of two or more memory modules), the processing entity issues instructions to the memory control component to program off-module data buffers and/or RCD components for single-module access at 609. As part of the programing in either case, the memory system components (data buffers and/or RCD components) may be programmed with information to indicate interface-selection signal sources, interface mode settings, per rank/bank lookup-table interface-selection values and so forth in accordance with options discussed above.

Figure 12:
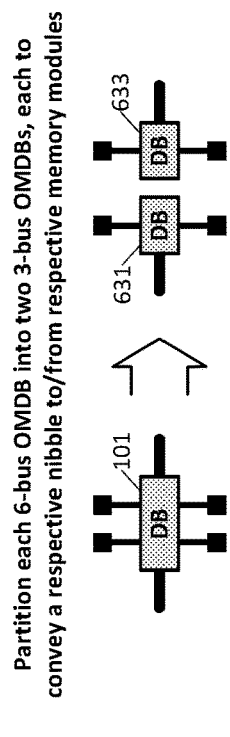
FIG. 12 illustrates an exemplary splitting of a dual-data-path off-module data buffer into separate integrated circuit components.

FIG. 12 illustrates an alternative implementation of the off-module data buffers discussed above—splitting dual-data-path off-module data buffer 101 into separate integrated circuit components 631, 633 each having a solitary data path such that data propagating through the off-module data buffer in a given memory access transaction is destined for (or received from) only one memory component (i.e., within a set of memory components corresponding to distinct and respective ranks) rather than two parallel memory components. The two integrated circuit data-buffer components 631, 633 may be implemented as discrete devices (e.g., soldered separately to landings on a motherboard or other substrate) or as side-by-side or stacked dies within a multi-die integrated circuit package. In either case, each off-module data buffer component 631 and 633 includes a primary data interface to be coupled to a memory control component and two secondary data interfaces to be coupled respectively to A and B memory-module sockets. Additional secondary data interfaces may be provided in data buffer components to be deployed in memory systems having three or more memory sockets.

Figure 13:
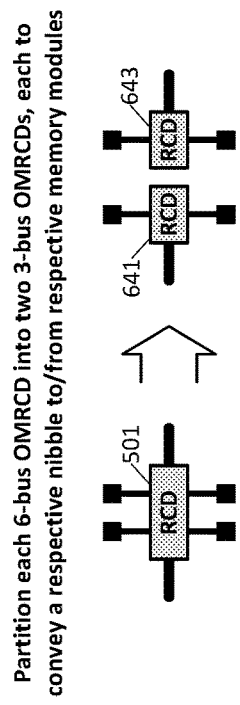
FIG. 13 illustrates an exemplary splitting of a dual-control-path off-module RCD component into separate integrated circuit components.

FIG. 13 illustrates an exemplary splitting of dual-channel off-module RCD component 501 into two distinct single-channel off-module RCD components 641, 643. In one embodiment, each single-channel off-module RCD component 641, 643 is implemented generally as shown by either half (583 or 585) of the FIG. 10 RCD component 581. That is, each RCD component includes a primary command/address/control channel, two secondary command/address/control channels (one for each of two sockets, though additional secondaries may be provided), and buffer communication interface. As with the split off-module data buffer components in FIG. 12, the single-channel RCD components 641, 643 may be implemented as discrete devices (e.g., soldered separately to landings on a motherboard or other substrate) or as side-by-side or stacked dies within a multi-die integrated circuit package.

Figure 14:
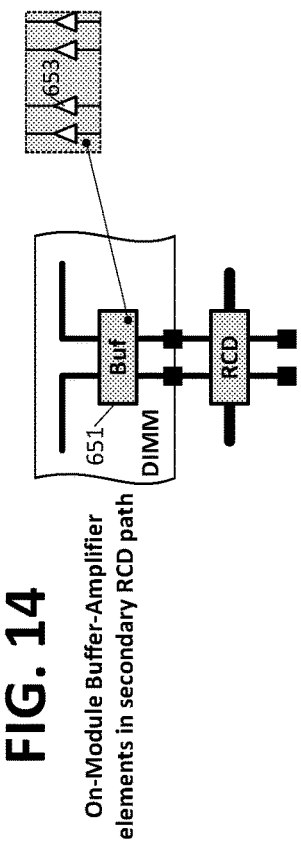
FIG. 14 illustrates an exemplary signal buffer component that may be deployed in the on-module command/address/control signal paths of memory modules intended for operation with the off-module RCD component of FIG. 10 or 13.

FIG. 14 illustrates an exemplary signal buffer component 651 that may be deployed in the on-module command/address/control signal paths of memory modules intended for operation with the off-module RCD component of FIG. 10 or 13. More specifically, one or more (or all) signals within the command/address/control path may be amplified (or repeated or restored to desired signal level) by respective amplifier/signal-driver circuits 653 within buffer component 651, thus avoiding signal-integrity problems that may arise on signal lines coupled to multiple loads (e.g., numerous memory component contacts) or otherwise subject to high fan-out.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific numbers of bits, signal path widths, signaling or operating frequencies and the like can be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A data buffer integrated circuit (IC) comprising:
a control interface to receive configuration information;
a primary data interface to receive write data synchronously from a memory control component at a first signaling rate;
first and second secondary data interfaces to be coupled to first and second socketed memory modules, respectively; and
multiplexing circuitry, responsive to the configuration information, to receive the write data from the primary data interface and, in accordance with the configuration information, to convey the write data either (i) exclusively to one of the first and second secondary data interfaces for synchronous transmission to a corresponding one of the first and second socketed memory modules at the first signaling rate, or (ii) to both of the first and second secondary data interfaces for transmission to both the socketed first and second memory modules at a second signaling rate.

2. The data buffer IC of claim 1 wherein the second signaling rate is half the first signaling rate.

3. The data buffer IC of claim 1 wherein the primary data interface comprises a timing signal input to receive a first timing signal that transitions at the first signaling rate and a plurality of sampling circuits to sample the write data in response to the transitions of the first timing signal, and wherein the first and second secondary interfaces comprise respective first and second timing signal outputs.

4. The data buffer IC of claim 3 wherein the first timing signal output or the second timing signal output drives a write data timing signal exclusively to one of the first and second socketed memory modules at the first signaling rate if the write data is conveyed exclusively to one of the first and second secondary interfaces.

5. The data buffer IC of claim 4 wherein the first timing signal output and the second timing signal output drive respective write data timing signals to the first and second socketed memory modules at the second signaling rate if the write data is conveyed to both the first and second secondary interfaces.

6. The data buffer IC of claim 3 further comprising timing calibration circuitry to adjust phases of write data timing signals output via the first and second timing signal outputs.

7. The data buffer IC of claim 1 wherein the control interface to receive configuration information is additionally to receive information, from a source other than the memory control component, indicative of a memory write operation to which the write data corresponds.

8. A method of operation within a data buffer integrated circuit (IC), the method comprising:

receiving configuration information from a registered clock driver component via a control interface;

receiving write data from a memory control component via a primary data interface synchronously at a first signaling rate; and conveying the write data, in accordance with the configuration information, either (i) exclusively to one of first and second secondary data interfaces for synchronous transmission to a corresponding one of first and second socketed memory modules at the first signaling rate, or (ii) to both of the first and second secondary data interfaces for transmission to both the first and second socketed memory modules at a second signaling rate.

9. The method of claim 8 wherein the second signaling rate is half the first signaling rate.

10. The method of claim 8 wherein receiving the write data synchronously via the primary data interface comprises receiving, via the primary data interface, a first timing signal that transitions at the first signaling rate and sampling the write data in response to the transitions of the first timing signal.

11. The method of claim 10 further comprising driving a write data timing signal via a first timing signal output or a second timing signal output exclusively to one of the first and second memory modules at the first signaling rate if the write data is conveyed exclusively to one of the first and second secondary interfaces.

12. The method of claim 11 further comprising driving respective write data timing signals via the first and second timing signal outputs to the first and second memory modules at the second signaling rate if the write data is conveyed to both the first and second secondary interfaces.

13. The method of claim 12 further comprising adjusting phases of the write data timing signals in a timing calibration operation.

14. The method of claim 8 further comprising receiving, from the registered clock driver component, information indicative of a memory write operation to which the write data corresponds.

15. A memory system comprising:
a printed circuit board;
a memory control component mounted to the printed circuit board;
first and second memory sockets mounted to the printed circuit board and having electrical contacts to electrically engage counterpart electrical contacts of memory modules to be inserted into the first and second memory sockets; and
data buffer components mounted to the printed circuit board, each data buffer component having:
a primary data interface electrically coupled to the memory control component,
a first secondary data interface electrically coupled to a first subset of the electrical contacts within the first memory socket, and
a second secondary data interface electrically coupled to a first subset of the electrical contacts within the second memory socket.

16. The memory system of claim 15 further comprising a registered clock driver component mounted to the printed circuit board and having a buffer communication interface coupled to the data buffer components.

17. The memory system of claim 16 wherein the registered clock driver component comprises a primary control interface coupled to the memory control component, and first and second secondary control interfaces coupled to respective second subsets of the electrical contacts within the first and second memory sockets.

18. The memory system of claim 15 wherein each of the data buffer components comprises multiplexing circuitry to convey write data received at a first signaling rate via the primary data interface either (i) exclusively to one of the first and second secondary interfaces at the first signaling rate in a first operating mode, or (ii) to both the first and second secondary interfaces at a second signaling rate in a second operating mode.

19. The memory system of claim 18 wherein the second signaling rate is half the first signaling rate.

20. The memory system of claim 18 wherein the primary data interface within each of the data buffer components comprises (i) a timing signal input to receive a first timing signal that transitions at the first signaling rate and (ii) a plurality of sampling circuits to sample the write data in response to the transitions of the first timing signal; and wherein the first and second secondary interfaces comprise respective first and second timing signal outputs to output respective write data timing signals concurrently with write data transmitted to the first and second memory sockets.

* * * * *